United States Patent
Nowak et al.

(10) Patent No.: US 7,102,181 B1
(45) Date of Patent: Sep. 5, 2006

(54) STRUCTURE AND METHOD FOR DUAL-GATE FET WITH SOI SUBSTRATE

(75) Inventors: Edward J. Nowak, Essex Junction, VT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/907,971

(22) Filed: Apr. 22, 2005

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............ 257/250; 257/316; 257/321; 257/347; 257/619; 257/623; 257/E21.32; 257/E27.112

(58) Field of Classification Search ............ 257/250, 257/316, 321, 619, E21.32, E27.112
See application file for complete search history.

(56) References Cited

U.S. PATENT DOCUMENTS

| | | | |
|---|---|---|---|
| 6,107,133 A * | 8/2000 | Furukawa et al. | 438/239 |
| 6,413,802 B1 | 7/2002 | Hu et al. | |
| 2005/0224878 A1* | 10/2005 | Chang | 257/347 |
| 2005/0224890 A1* | 10/2005 | Bernstein et al. | 257/371 |
| 2005/0242395 A1* | 11/2005 | Chen et al. | 257/347 |
| 2005/0269629 A1* | 12/2005 | Lee et al. | 257/327 |
| 2005/0272190 A1* | 12/2005 | Lee et al. | 438/176 |

* cited by examiner

*Primary Examiner*—Jerome Jackson
*Assistant Examiner*—Jesse A. Fenty
(74) *Attorney, Agent, or Firm*—Gibb I.P. Law Firm, LLC; William D. Sabo, Esq.

(57) ABSTRACT

A method of forming a dual gate fin-type field effect transistor (FinFET) structure patterns silicon fins over an insulator and patterns a gate conductor at an angle to the fins. The gate conductor is formed laterally adjacent to and over center portions of the fins. The gate conductor is planarized such that the gate conductor is separated into distinct gate conductor portions that are separated by the fins. These gate conductor portions include front gates and back gates. The front gates and the back gates alternate along the structure, such that each fin has a front gate on one side and a back gate on the opposite side. Then front gate wiring is formed to the front gates and back gate wiring is formed to the back gates.

16 Claims, 20 Drawing Sheets

STRUCTURE AND METHOD FOR DUAL-GATE FET WITH SOI SUBSTRATE

BACKGROUND OF THE INVENTION

1. Field of the Invention

The invention generally relates to a dual-gate or split-gate FinFET structure and method that can be built on a conventional SOI wafer where, in a first embodiment, the back gate is built at the same level as the front gate, and the gate wiring uses sidewall-image transfer (SIT) shapes, and where, in a second embodiment, the back gate is buried and is fabricated by replacing the buried oxide layer with an oxide-conductor-oxide layer.

2. Description of the Related Art

A fin-type field effect transistor (FinFET) is a type of transistor that has a fin transistor channel covered by a gate conductor. The gate conductor covers the channel portion of the fin and source and drain portions of the fin extend beyond the coverage of the gate conductor. FinFETs are discussed at length in U.S. Pat. No. 6,413,802 to Hu et al. (hereinafter "Hu"), which is incorporated herein by reference.

Dual-gate transistors have electrodes on either side of a MOS channel. For thin body transistors, especially FinFET transistors, having a back gate is a method for achieving threshold voltage control when the channel is essentially fully-depleted. This disclosure introduces a split-gate Fin-FET structure and method that can be built on a conventional SOI wafer.

SUMMARY OF THE INVENTION

One embodiment herein presents a method of forming a dual gate fin-type field effect transistor (FinFET) structure. The method patterns silicon fins over an insulator and patterns a gate conductor at an angle (such as substantially perpendicular, at a 30° angle, 45° angle, etc.) to the fins. The gate conductor is formed laterally adjacent to and over center portions of the fins. The gate conductor is planarized such that the gate conductor is separated into distinct gate conductor portions that are separated by the fins. These gate conductor portions include front gates and back gates. The front gates and the back gates alternate along the structure, such that each fin has a front gate on one side and a back gate on the opposite side. The invention then forms front gate wiring to the front gates and back gate wiring to the back gates.

The front gates are electrically isolated from the back gates. The invention also forms insulators above the fins. The fins and the insulators keep the front gates and the back gates electrically isolated. The processes of forming the front gate wiring and forming the back gate wiring can comprise sidewall image transfer processes.

The process of forming the back gate wiring directs the back gate wiring in a direction opposite to that of the front gate wiring, such that the front gate wiring extends in a first direction away from the front gates and the back gate wiring extends in an opposite direction away from the back gates. The invention also forms sources and drains in ends of the fins, as well as source and drain wiring connected to the source and drains at the ends of the fins. The front gate wiring and the back gate wiring are insulated from and extend over the source and drain wiring.

Thus, in one embodiment, the invention produces a dual gate fin-type field effect transistor (FinFET) structure that has silicon fins over an insulator. The center portions of the fins comprise channel regions and end portions of the fins comprise source and drain regions. Front gates and back gates are positioned adjacent the center portions of the fins, wherein the front gates and back gates alternate along the length of the structure, such that each fin has a front gate on one side and a back gate on the opposite side.

The front gate wiring and the back gate wiring is substantially parallel to the fins and the front gate wiring extends in a first direction away from the front gates and the back gate wiring extends in an opposite direction away from the back gates. The front gates and the back gates are positioned in a linear manner along the structure at an angle to the fins.

Another embodiment of the invention presents a method of forming a dual gate fin-type field effect transistor (FinFET). This method forms a silicon layer on a buried oxide layer and then patterns mandrels on the silicon layer. The buried back gate can be a material other than poly, e.g., a deposited metal or silicon-germanium. Sidewall spacers are formed on sidewalls of the mandrels to leave portions of the underlying silicon exposed.

An etching process is performed through the exposed areas of the silicon layer adjacent to the center portions of the mandrels. This process also etches portions of the buried oxide layer that are adjacent to the center portions of the mandrels. This can comprise multiple directional and non-directional etching processes. This etching process removes the buried oxide from below the areas of the silicon layer that are adjacent the center portions of the mandrels. This leaves suspended bridges of silicon covered by the mandrels and the sidewall spacers.

Next, first gate oxides are formed on exposed portions of the silicon bridges. Then this embodiment deposits a back gate conductor into the openings that were created by the etching process. Thus, the back gate conductor is positioned below and beside the silicon bridges. The invention forms an insulator over the portions of the back gate conductor that is between the bridges to electrically isolate the back gate conductor from the latter formed front gate conductor.

After this, the mandrels are removed so as to leave the sidewall spacers in place. Then, the silicon bridges are etched in a sidewall image transfer process using the sidewall spacers as a mask to leave silicon fins. The invention then forms a second gate oxide on the exposed portions of the silicon fins. Next, the front gate conductor is formed over the center portions of the fins and between the fins such that the ends of the fins extend from the front gate conductor. Source and drain regions are formed in the ends of the fins by removing the source/drain protect layer from the ends of the fins and implanting impurities in the ends of the fins.

The fin can contain a well implant, halo implants, extension implants, or other implants. These can be added to the crystalline silicon starting wafer or they can be added after the gate stack is in place. The polysilicon used to form the back gate can be in-situ doped, or subsequent implanting can be used. The top gate can similarly be in-situ doped or ion-implanted. Also, the invention forms separate contacts to the front gate conductor and the back gate conductor. The process of depositing the back gate conductor, and the process of patterning the front gate conductor, form gate conductors that are at an angle to the fins.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1A:
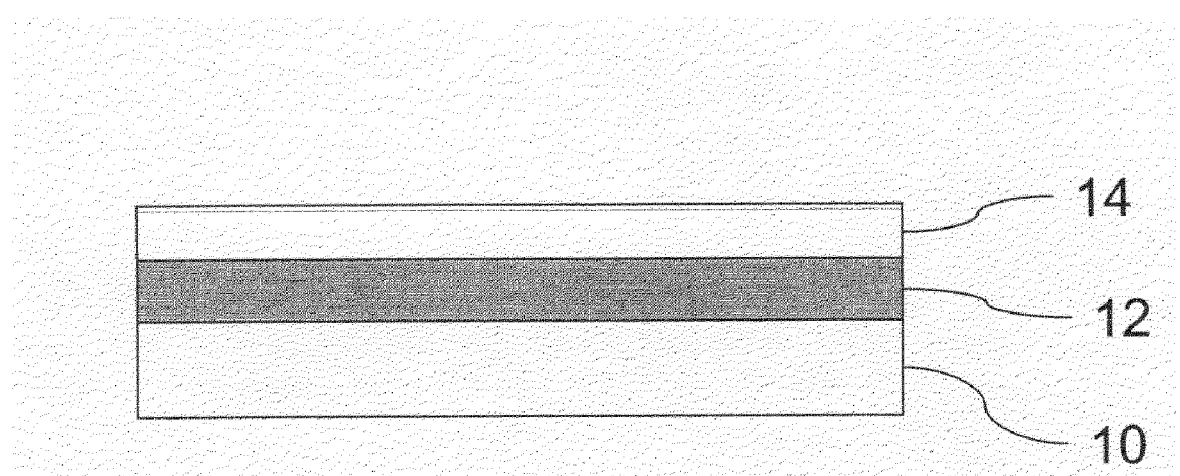
FIGS. 1A and 1B are schematic side and top view diagrams of a partially completed FinFET structure according to a first embodiment of the invention.
Figure 1B:
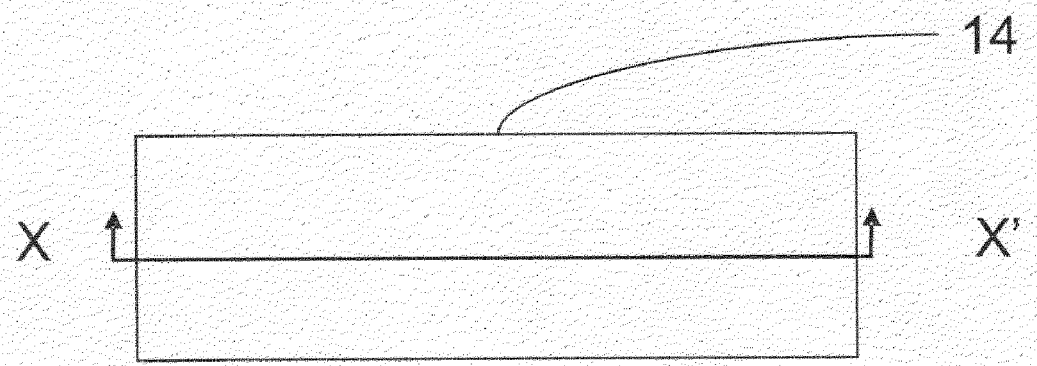

Dual-gate transistors have electrodes on either side of a MOS channel. For thin body transistors, especially FinFET transistors, having a back gate is a method for achieving threshold voltage control when the channel is essentially fully-depleted. This disclosure introduces a split-gate FinFET structure and method that can be built on a conventional SOI wafer. In the first embodiment, the back gate is built at the same level as the front gate, and the gate wiring uses sidewall-image transfer (SIT) shapes. In the second embodiment, the back gate is buried and is fabricated by replacing the buried oxide layer with an oxide-conductor-oxide layer. The second embodiment can allow higher density than the first; however, the first embodiment does not require a buried gate.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

The first embodiment shown in FIGS. 1A–8B includes a method of forming a dual gate fin-type field effect transistor (FinFET) structure. The A Figures of FIGS. 1A–17B illustrate cross-sectional views along line X–X' of the top-view B Figures (note that for clarity, only FIGS. 1B and 9B show line X–X'). FIGS. 1A–1B illustrate a silicon-on-insulator (SOI) structure that includes a wafer substrate 10, an insulating layer 12 (e.g., formed by a SIMOX or wafer bonding process), and silicon layer 14. The methodologies and materials for making such an isolated-substrate integrated chip structure are well-known to those ordinarily skilled in the art and are not discussed in detail herein. Further, the materials mentioned herein and shown in the drawings are merely examples and other similar material compositions could be used with the invention. For example, instead of silicon 14, a material having similar operational characteristics (whether now known or developed in the future) could be used in place of the silicon.

Figure 2A:
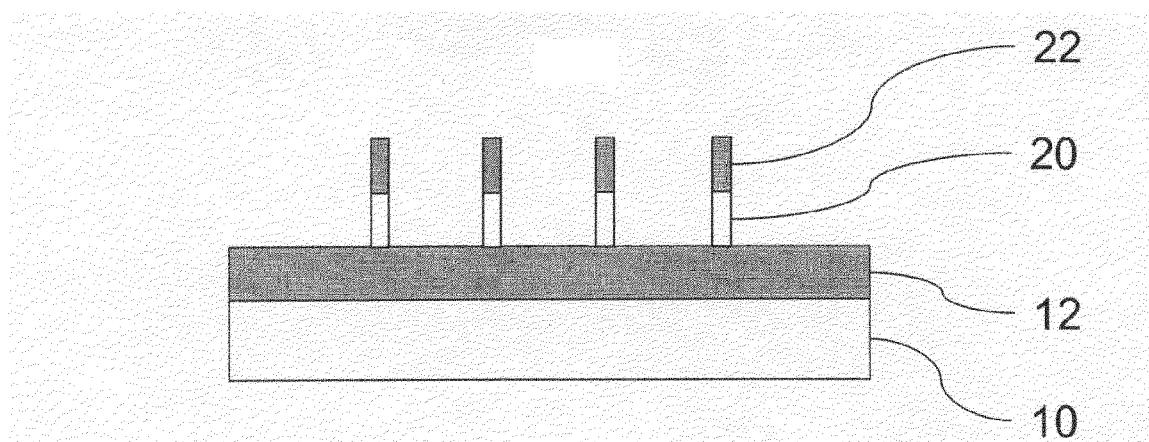
FIGS. 2A and 2B are schematic side and top view diagrams of a partially completed FinFET structure according to a first embodiment of the invention.
Figure 2B:
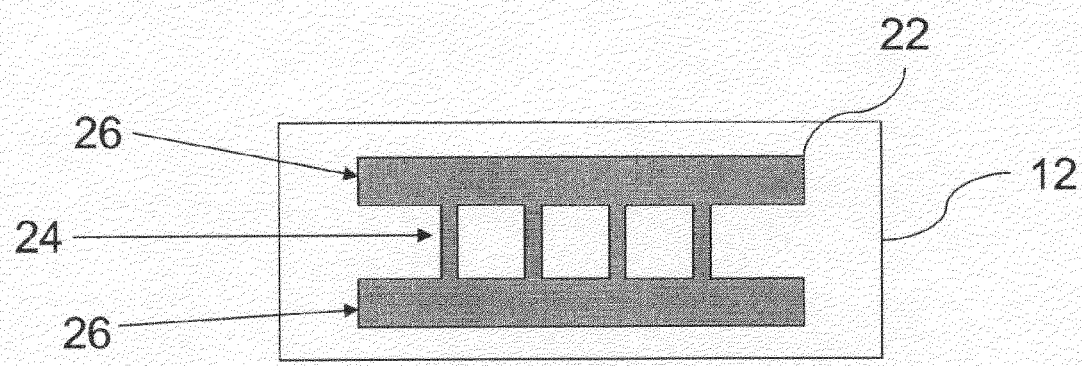

As shown in FIGS. 2A–2B, after depositing an insulator layer on silicon 14, the method patterns silicon fins 20 and an insulator cap 22 over the insulator 12. As shown in the top view of FIG. 2B, fin structures 24 as well as source and drain conductors 26 are included in the patterned structure. The etched structure is a sandwich of oxide and silicon. These structures can be formed using any patterning process, such as material deposition/growth, followed by well-known photolithographic mask etching or sidewall image transfer processing.

Figure 3A:
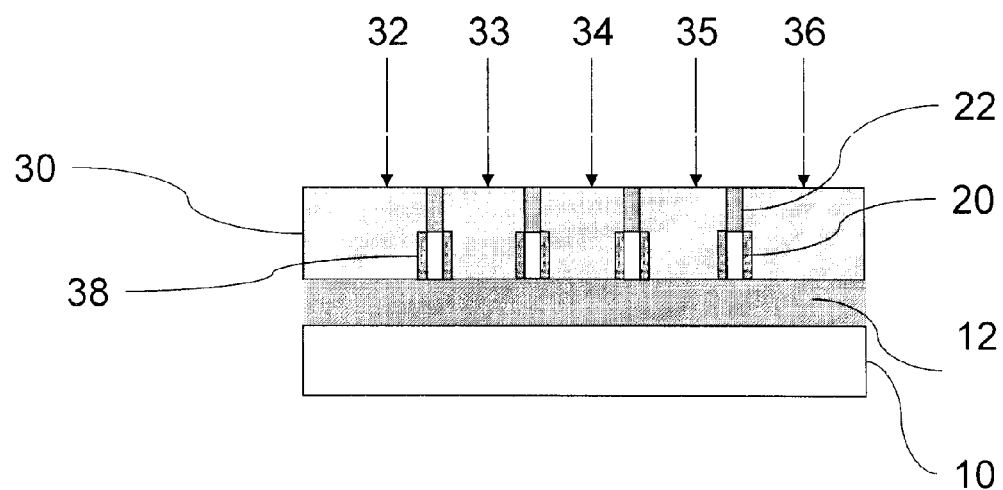
FIGS. 3A and 3B are schematic side and top view diagrams of a partially completed FinFET structure according to a first embodiment of the invention.
Figure 3B:
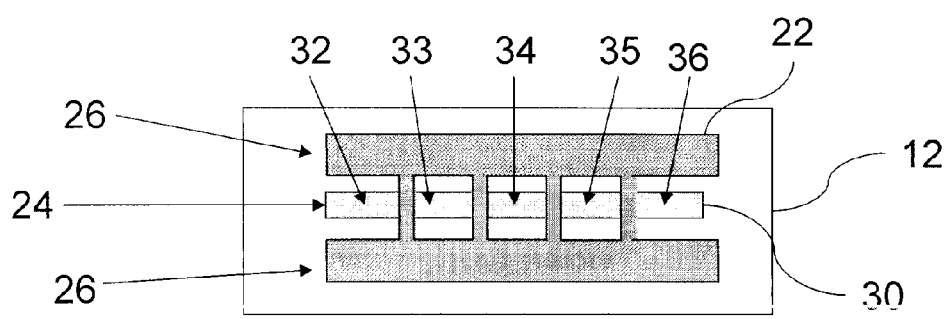

The invention forms or grows gate oxides 38 on the sides of the fins 20 using well-known oxidation and/or insulator formation techniques as shown in FIGS. 3A–3B. The invention then patterns a gate conductor 30 at an angle (such as substantially perpendicular, at a 30° angle, 45° angle, etc. (not parallel to)) to the fins 24, using patterning processes such as those discussed above. The conductors described herein can be any kind of conductive material including, but not limited to metals, alloys, doped silicon, polysilicon, etc. The gate conductor 30 is formed laterally adjacent to and over center portions of the fins. The gate conductor 30 is planarized such that the gate conductor is separated into distinct gate conductor portions 32–36 that are separated by the fins 20. The process used to planarize the gate conductor can comprise any conventional planarization process including chemical mechanical polishing, chemical rinsing, etc. in addition, the planarization process can use the oxide 22 for etch endpoint detection.

These gate conductor portions 32–36 include front gates 33, 35, and back gates 32, 34, 36. As shown in FIGS. 3A and 3B, the front gates 33, 35 and the back gates alternate along the length of the structure, such that each fin 20 has a front gate on one side and a back gate on the opposite side. The front gates are electrically isolated from the back gates. The fins 14 and the insulators 22 keep the front gates and the back gates electrically isolated.

Figure 4A:
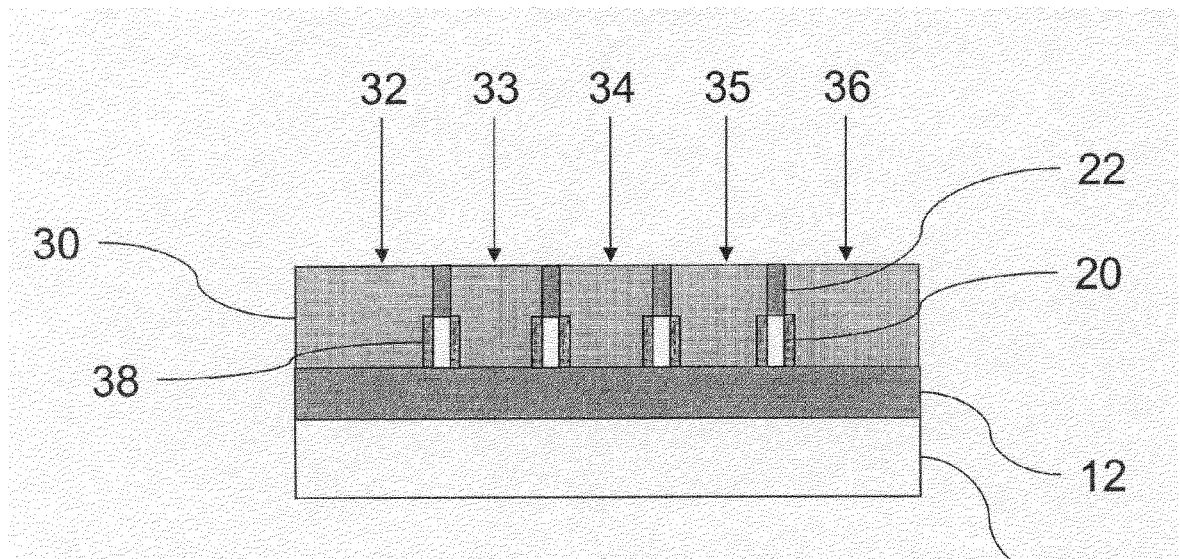
FIGS. 4A and 4B are schematic side and top view diagrams of a partially completed FinFET structure according to a first embodiment of the invention.
Figure 4B:
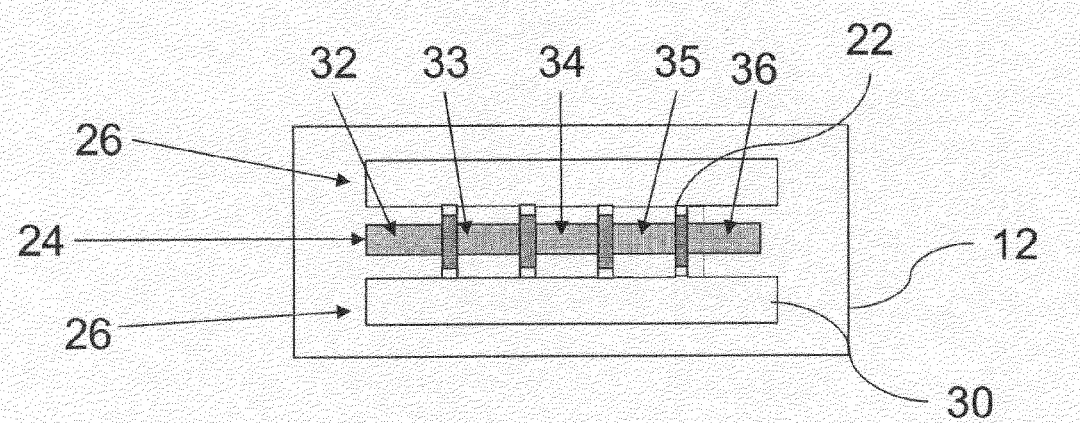
Figure 5A:
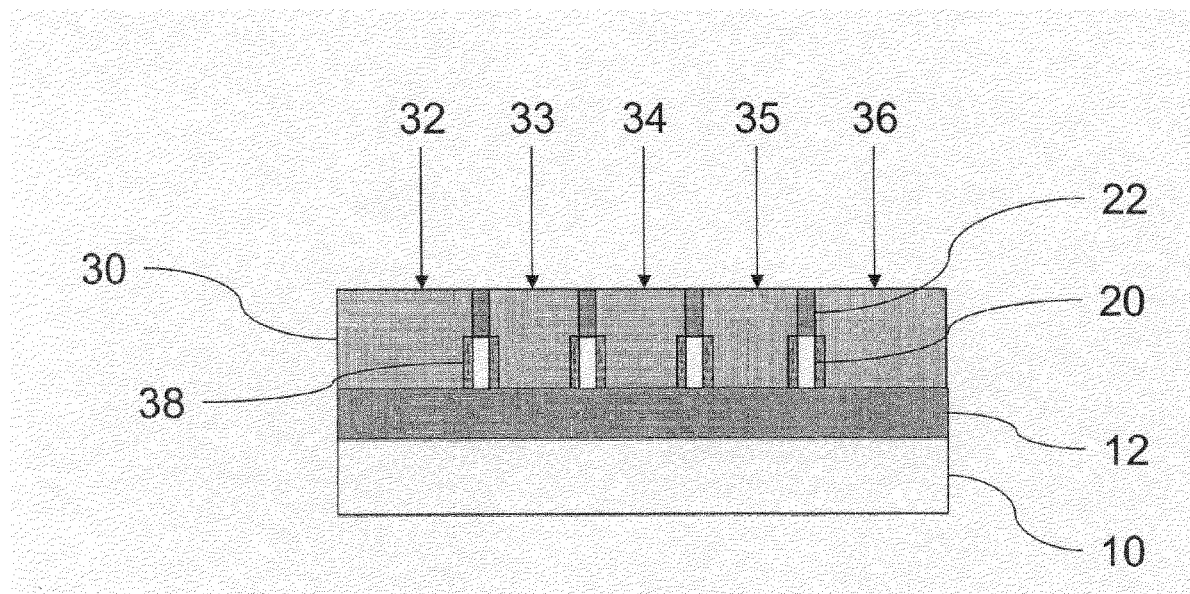
FIGS. 5A and 5B are schematic side and top view diagrams of a partially completed FinFET structure according to a first embodiment of the invention.
Figure 5B:
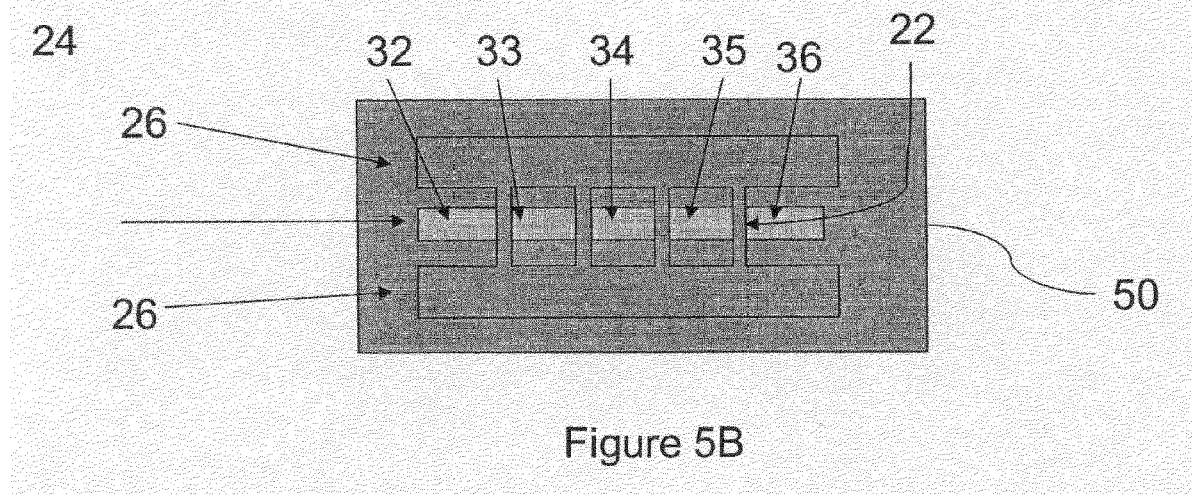

At this point, angled channel implants such as halo implants can be performed and selective silicon structures can be formed on the thin bodies adjacent to the source and drain regions to reduce series resistance, if desired, using well-known methods and processes. As shown in FIGS. 4A and 4B, the excess insulator 38 can be selectively removed in a masked removal process. Such material removal processes are well-known to those ordinarily skilled in the art and involve patterning a mask over the area where the oxide 38 is to remain and then performing a material removal process such as chemical rinsing, etching, etc. to remove the oxide 38 from the areas not protected by the mask. Optionally, the excess insulator can be removed using a wet chemical etchant dip without a masking step, removing 22 as well as insulator over source and drain regions. Also optionally, silicidation of the source and drain regions 26 can be performed now using techniques known in the art. In FIGS. 5A and 5B, another insulator 50, such as an oxide, is deposited over the structure and planarized again down to the tops of the insulators 22 (if present, otherwise this fills the cavity on top of gate conductor 32–36). This deposition/material growth and planarization process is similar to those discussed above.

Figure 6A:
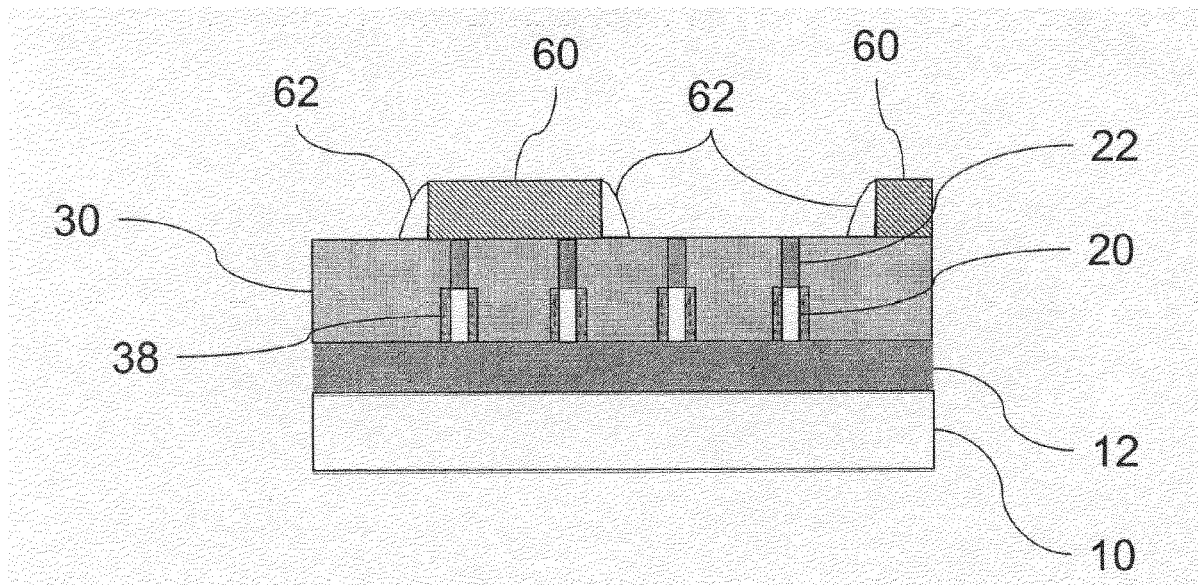
FIGS. 6A and 6B are schematic side and top view diagrams of a partially completed FinFET structure according to a first embodiment of the invention.
Figure 6B:
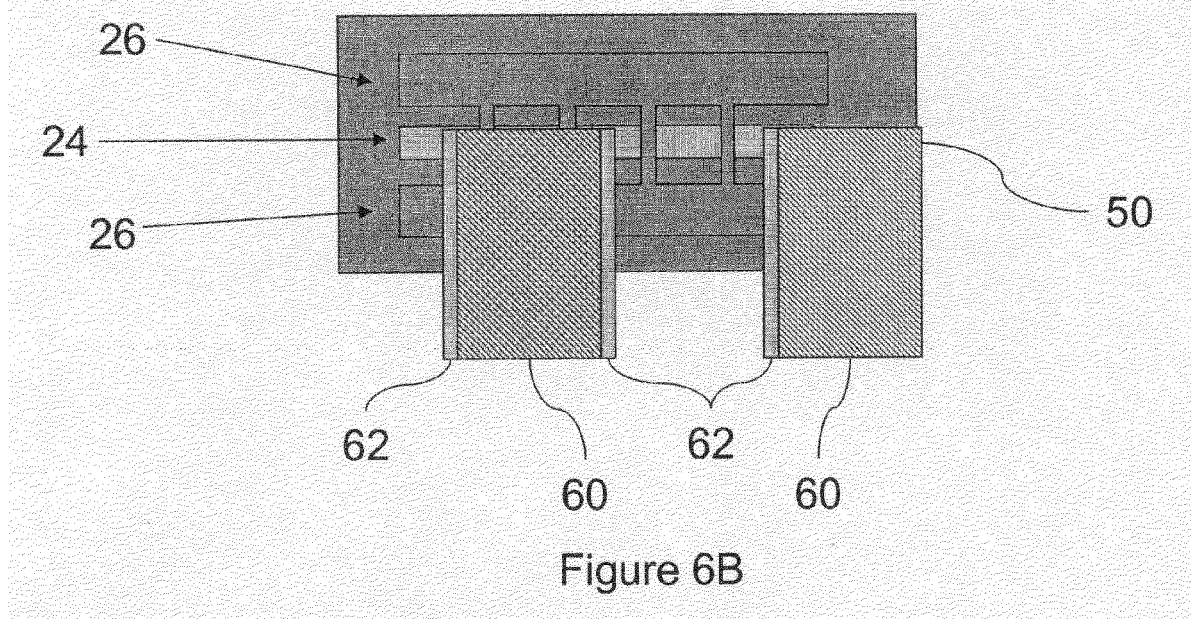
Figure 7A:
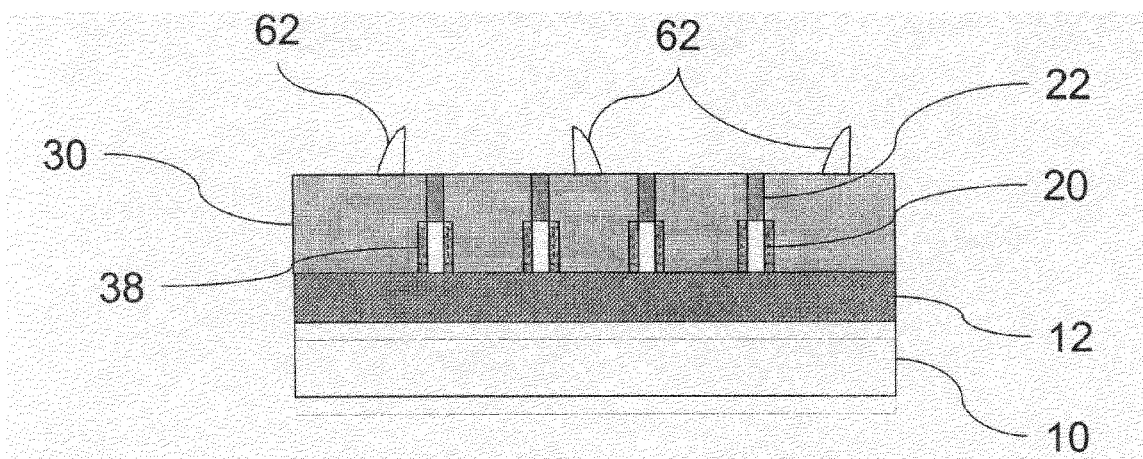
FIGS. 7A and 7B are schematic side and top view diagrams of a partially completed FinFET structure according to a first embodiment of the invention.
Figure 7B:
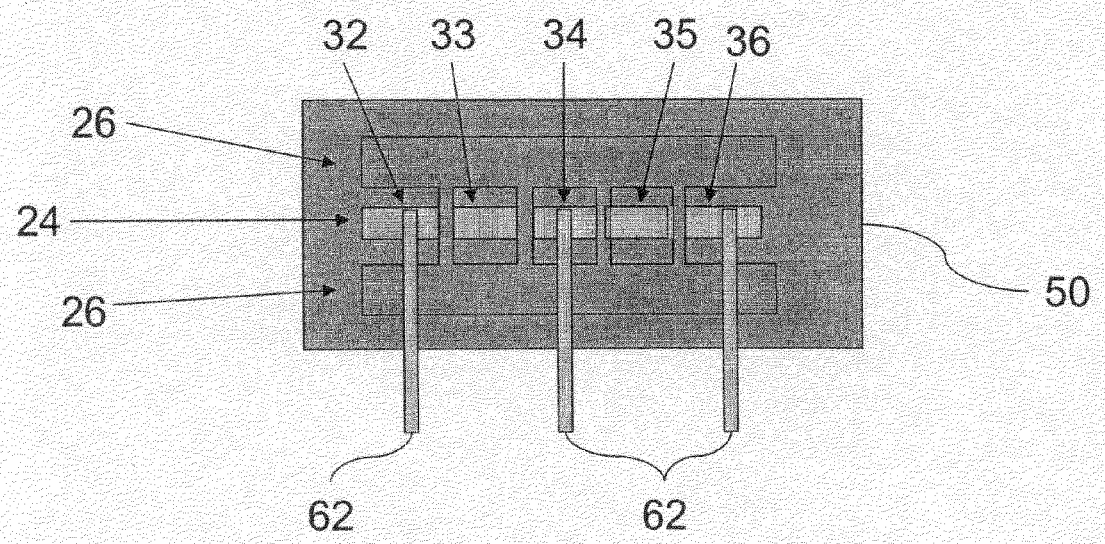

The invention then forms front gate wiring to the front gates and back gate wiring to the back gates using either a photolithographic patterning technique or a sidewall image transfer technique. In the sidewall image transfer technique, mandrels 60 are patterned (again using the above discussed patterning techniques) over the structure as shown in FIGS. 6A and 6B. Then conductive sidewall spacers 62 are formed on the sidewalls of the mandrels 60. The sidewall spacers 62 are formed by depositing a conductive material such as in-situ doped polysilicon and then selectively removing the conductive material from horizontal surfaces using a process such as a anisotropic reactive ion etch (RIE), thereby allowing the conductive material to remain only on the vertical sidewalls surfaces. Alternatively, the conductive material to be patterned is a metal formed by the exemplary process of sputtering or a metal alloy. Next, as shown in FIGS. 7A and 7B, the mandrels 60 are removed leaving the sidewall spacers 62 as conductive wires connected to the back gates 32, 34. The sidewall spacers can be trimmed as necessary, again using selective masking and etching techniques.

Figure 8A:
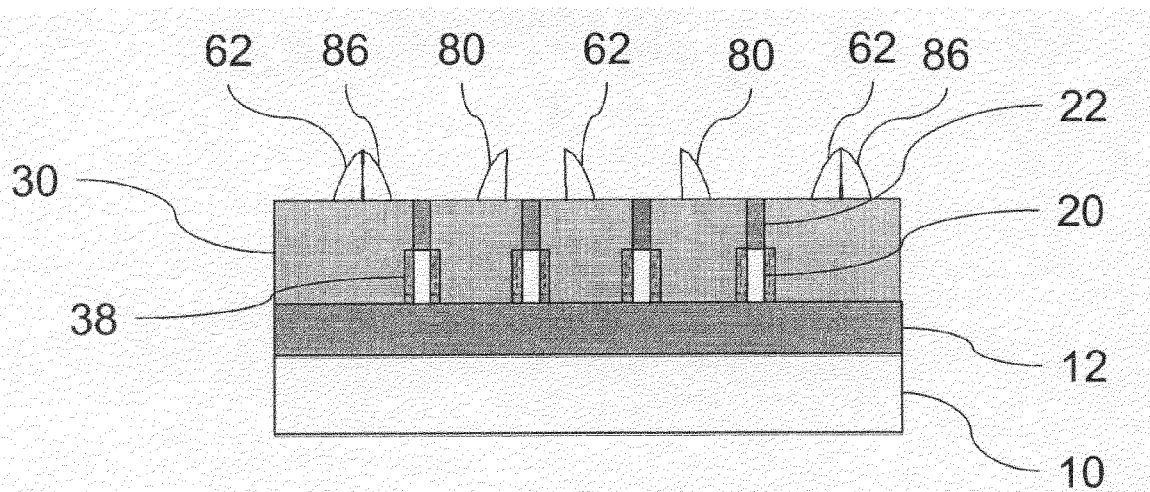
FIGS. 8A–8D are schematic side and top view diagrams of a partially completed FinFET structure according to a first embodiment of the invention.
Figure 8B:
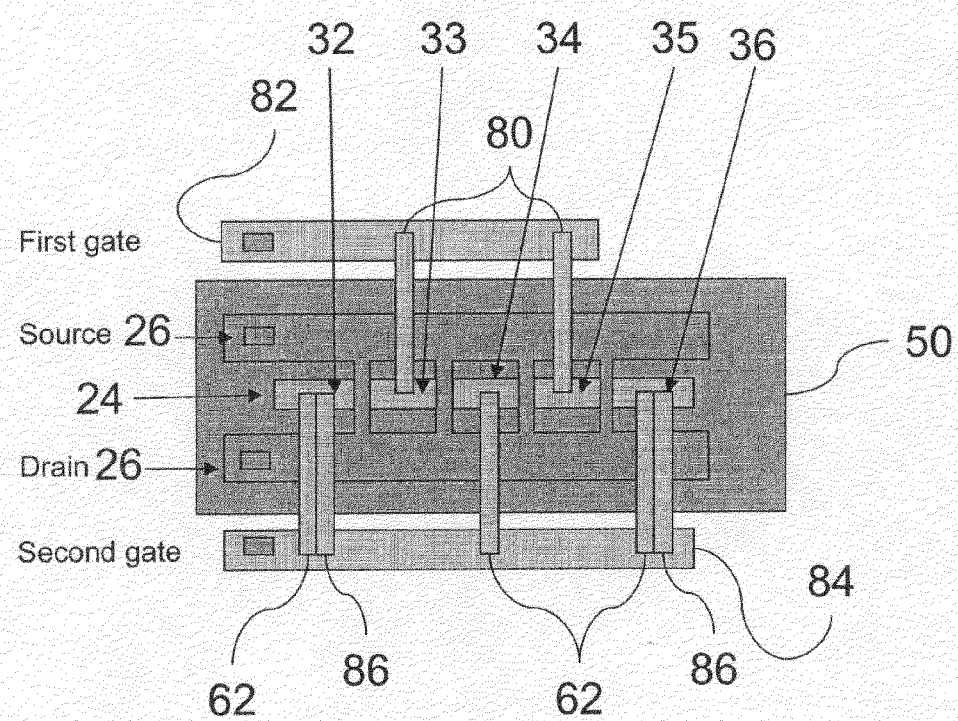

This sidewall image transfer process is repeated to form conductive wiring 80 to the front gates 33, 35, as shown in FIGS. 8A and 8B. At this point in the process a silicidation step using known techniques can be performed to increase conductivity in the gate wiring, gate, source, and drain regions. In addition, if desired, the wiring to the specific gates (e.g. 32, 36) can be doubled in this process by forming sidewall spacers 86 against previously formed sidewall spacers 62 using the above processing, as shown in FIGS. 8A and 8B. Contacts and wiring for the front and back gate 82, 84 (for the first gate and second gate) can be formed also using photolithographic processing as discussed above. FIG. 8B also illustrates contacts within the source and drain 26 and within the front and back gate wiring 82, 84. While FIGS. 6A–8B illustrate multiple SIT steps for forming the front and back gates, one ordinarily skilled in the art would understand that a single SIT process could be used to simultaneously form the front and back gates.

Figure 8C:
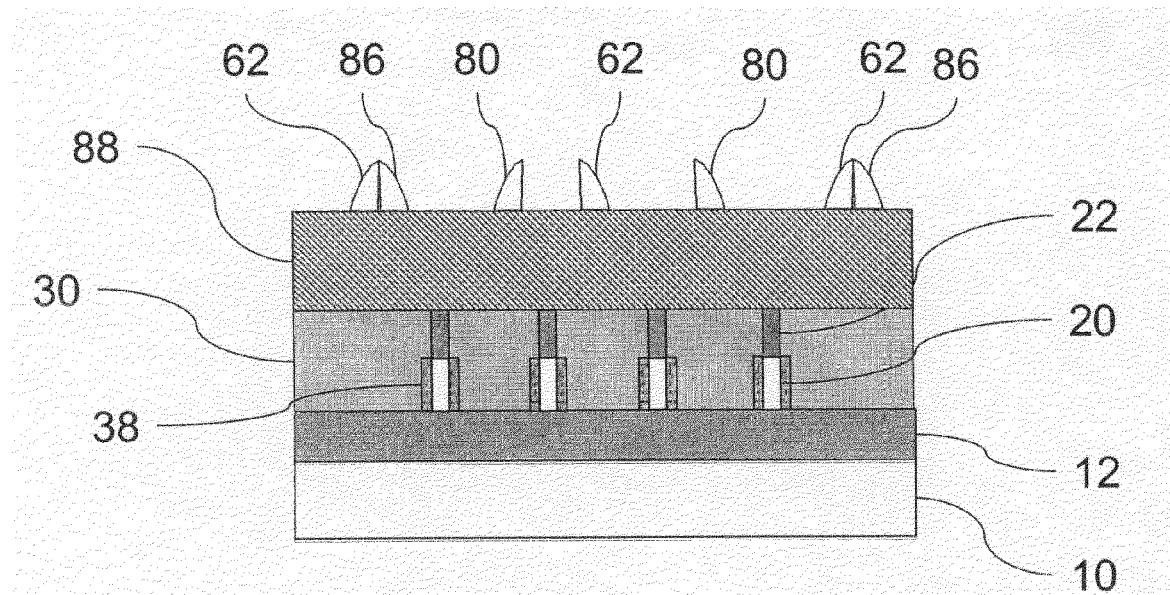
Figure 8D:
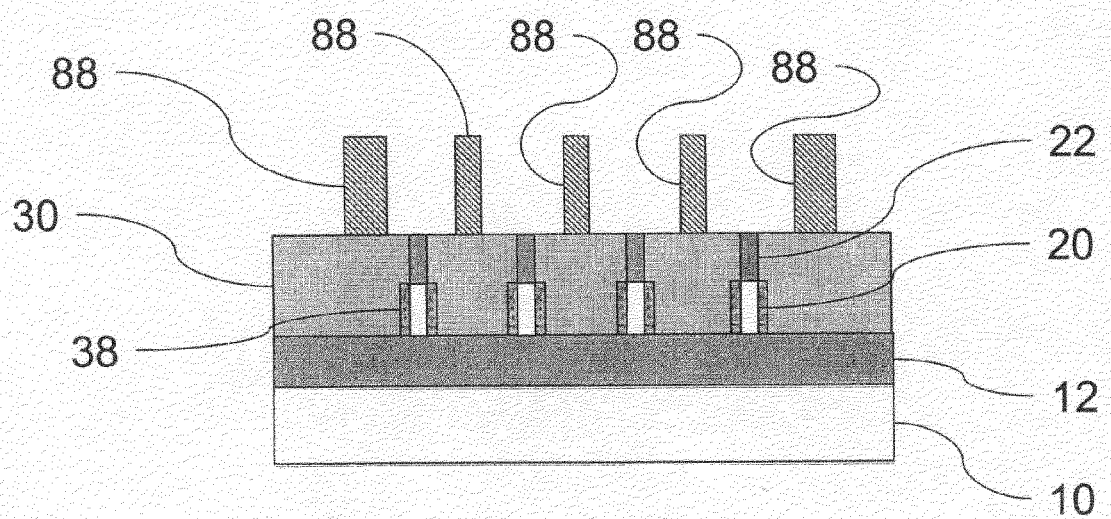

Alternatively, the invention can use fin wires in place of the conductive sidewall spacers, as shown in FIGS. 8C and 8D. This alternative is similar to the above, except that the SIT shapes 62, 80, 86 are formed of a masking material (e.g., nitride, etc.), instead of a conductive material, and these mask shapes are formed over a previously deposited conductive layer 88. The conductive layer 88 is then patterned using the shapes 62, 80, 86 as a mask leaving fin wires 88. This approach has the alignment advantages of the original SIT wiring, however, lower wiring resistance is achieved because the wiring volume is larger with the fin wires when compared to the sidewall spacer wires.

The process of forming the back gate wiring directs the back gate wiring 62, 86 in a direction opposite to that of the front gate wiring 80, such that the front gate wiring 80 extends in a second direction away from the front gates 33, 35 and the back gate wiring 62, 86 extends in an opposite direction away from the back gates 32, 34, 36. The front gate wiring 80 and the back gate wiring 62, 86 extend over the source and drain wiring 26 and are insulated from the source and drain wiring 26 by the insulator 50.

Thus, in one embodiment, the invention produces a dual gate fin-type field effect transistor (FinFET) structure that has silicon fins 20 over an insulator. The center portions of the fins 20 comprise channel regions and end portions of the fins 20 comprise source and drain regions. Front gates 33, 35 and back gates 32, 34, 36 are positioned adjacent the center portions of the fins 20, wherein the front gates 33, 35 and back gates 32, 34, 36 alternate along the length of the structure, such that each fin has a front gate on one side and a back gate on the opposite side.

The front gate wiring 80 and the back gate wiring 62, 86 are substantially parallel to the fins 20 and the front gate wiring 80 extends in a second direction away from the front gates 33, 35 and the back gate wiring 62, 86 extends in an opposite direction away from the back gates 32, 34, 36. The front gates 33, 35 and the back gates 32, 34, 36 are positioned in a linear manner along the structure at an angle to the fins 20. Further, the front gate wiring 80 and the back gate wiring 62, 86 lie within the same plane and run perpendicular to the long dimension of gate conductor 30. The front gate wiring 80 and the back gate wiring 62, 86 can comprise either conductive sidewalls or conductive fins. Also, with this structure, the insulator 12 is below the front gates 33, 35 and the back gates 32, 34, 36, while the front gate wiring 80 and the back gate wiring 62, 86 are positioned above the front gates 33, 35 and the back gates 32, 34, 36.

Figure 9A:
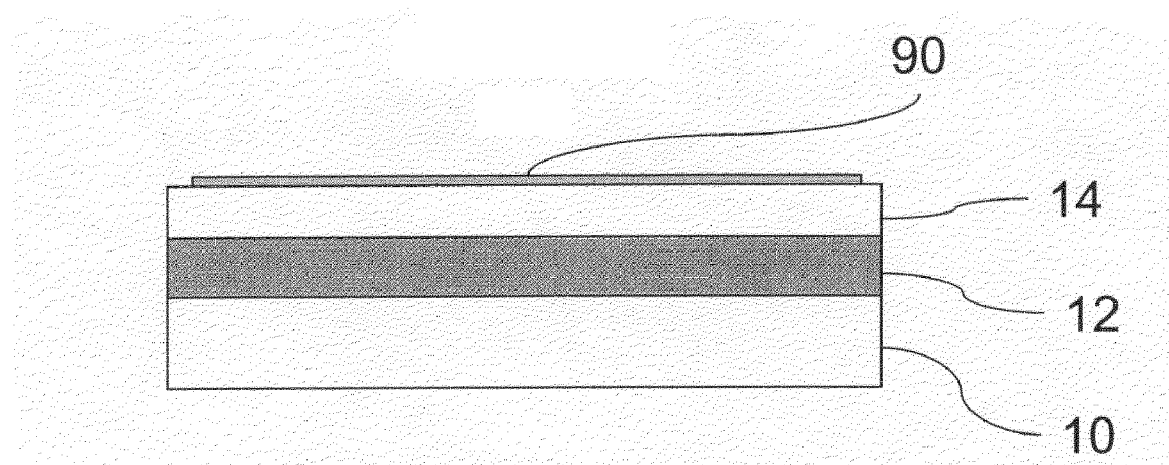
FIGS. 9A and 9B are schematic side and top view diagrams of a partially completed FinFET structure according to a second embodiment of the invention.
Figure 9B:
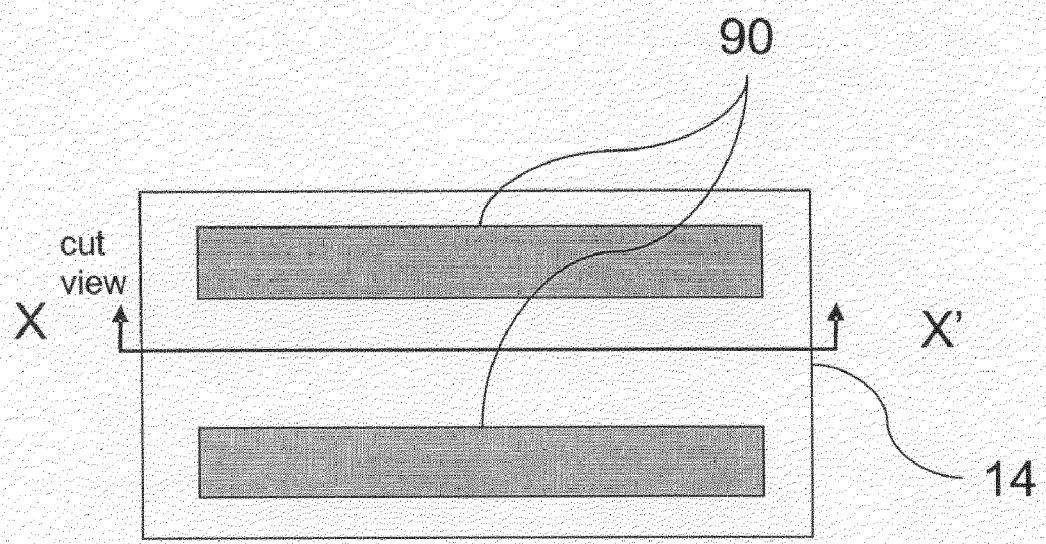

Another embodiment of the invention, shown in FIGS. 9A–17B, is a method of forming a dual gate fin-type field effect transistor (FinFET). This method forms a silicon layer 14 on a buried insulator layer 12, such as an oxide, that overlies a substrate wafer 10 as shown in FIGS. 9A and 9B. An insulator 90, such as in nitride, etc., is patterned over the silicon 14 using conventional patterning techniques such as those discussed above, as a mask for the source and drain wires/contacts that will eventually be patterned into the silicon layer 14.

Figure 10A:
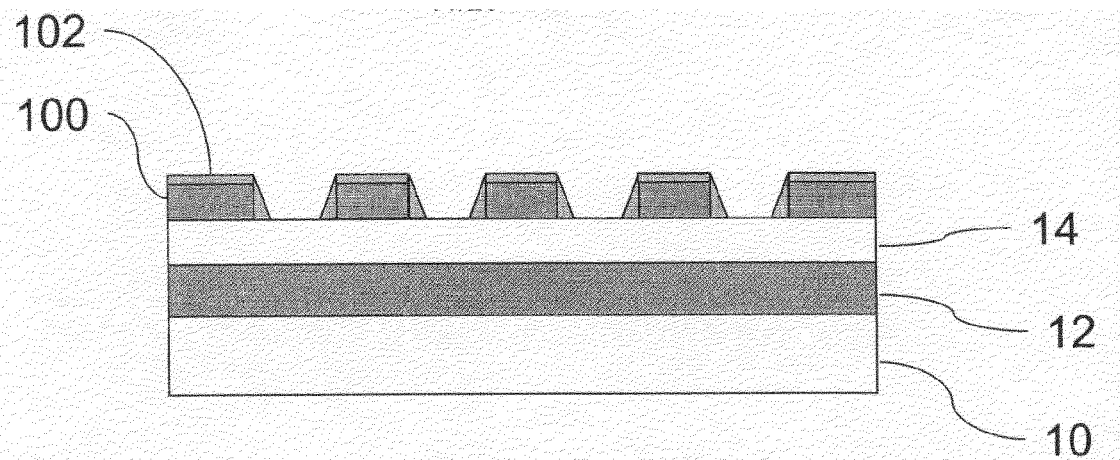
FIGS. 10A and 10B are schematic side and top view diagrams of a partially completed FinFET structure according to a second embodiment of the invention.
Figure 10B:
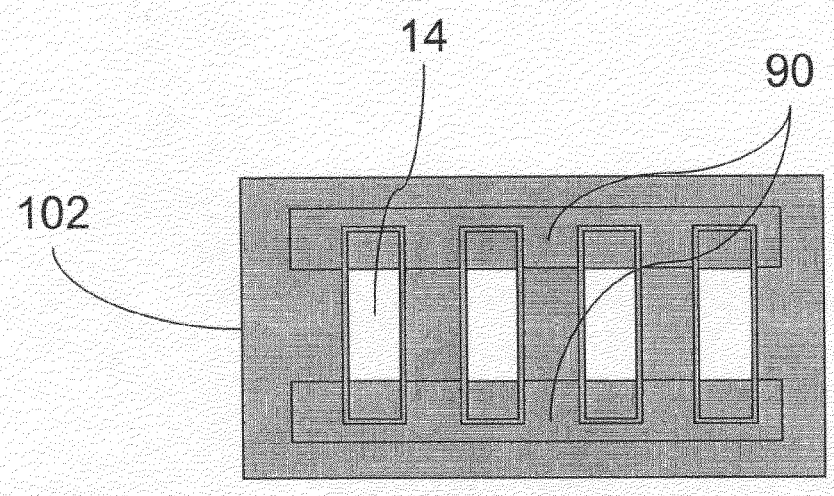

As shown in FIGS. 10A and 10B, insulating mandrels 100 are patterned using conventional patterning techniques. An exemplary mandrel has a bottom thick oxide layer and a top thin nitride, where the layer types are selected to be compatible with subsequent etch steps. The mandrel layer stack is formed first and then etched via reactive ion etching (RIE). Then the spacers are added. It is difficult to form an oxide mandrel and then add top nitride layer and spacers. Thus, a different insulator 102 (such as a nitride) than that used for the mandrels 100 is formed over and around the mandrels 100. The sidewall insulator 103 along the mandrels will eventually become the sidewall image transfer mask for the silicon fins of the FinFETs being formed. Note that, as most clearly shown in FIG. 10B, portions of the silicon 14 are exposed between the spacers 102 using, for example, an anisotropic etch process or other etching process that endpoints on the exposed silicon 14.

Figure 11A:
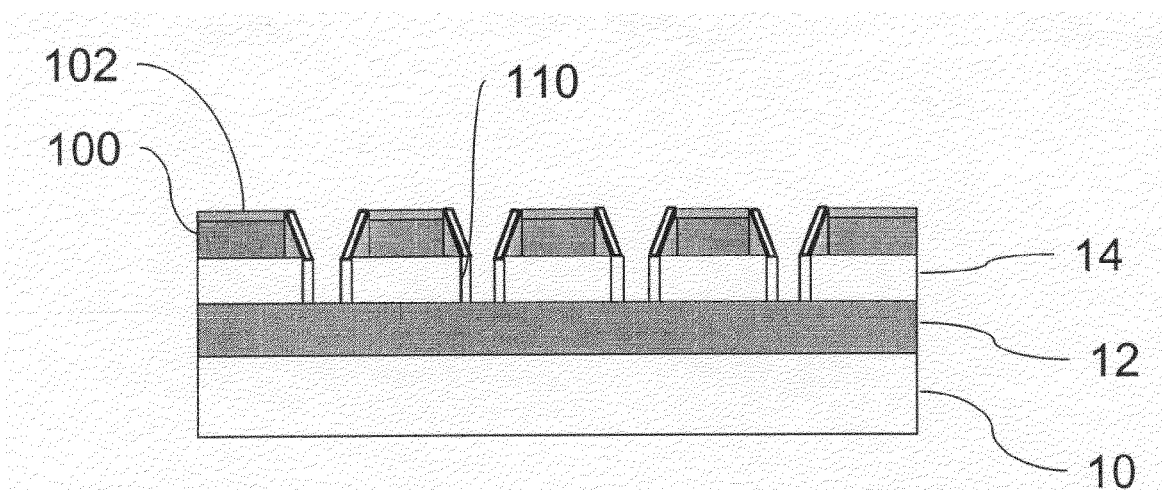
FIGS. 11A and 11B are schematic side and top view diagrams of a partially completed FinFET structure according to a second embodiment of the invention.
Figure 11B:
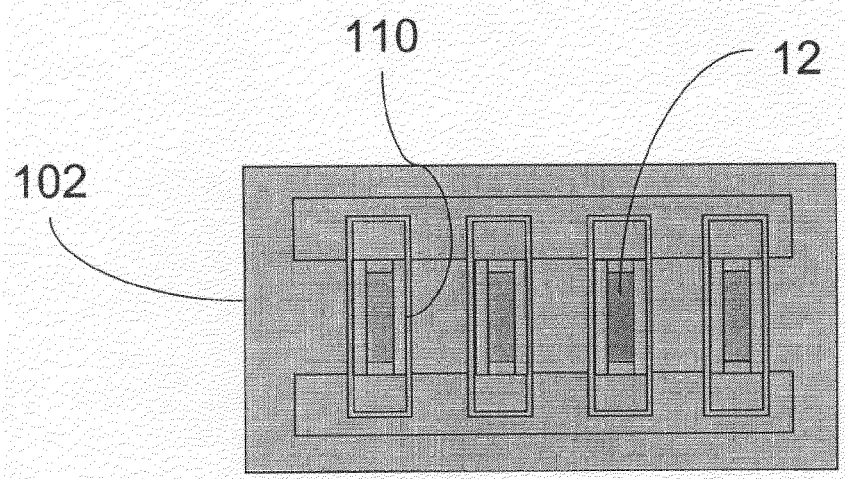
Figure 12A:
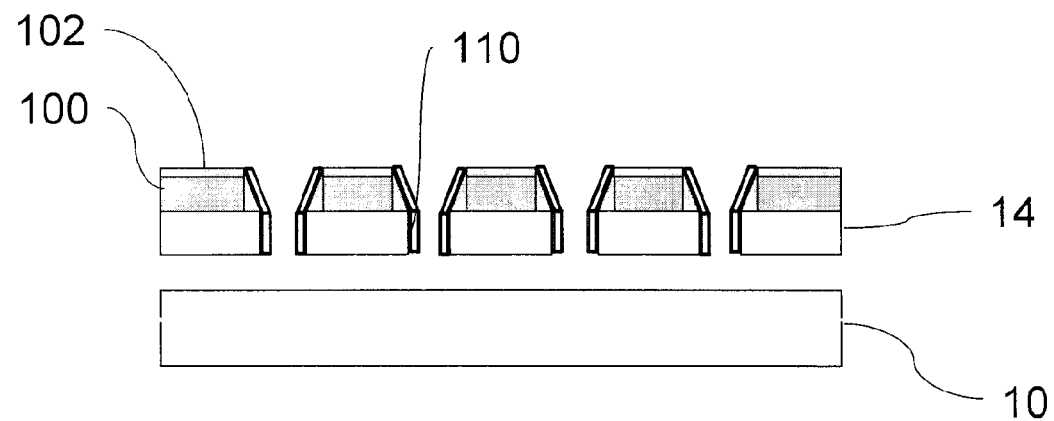
FIGS. 12A and 12B are schematic side and top view diagrams of a partially completed FinFET structure according to a second embodiment of the invention.
Figure 12B:
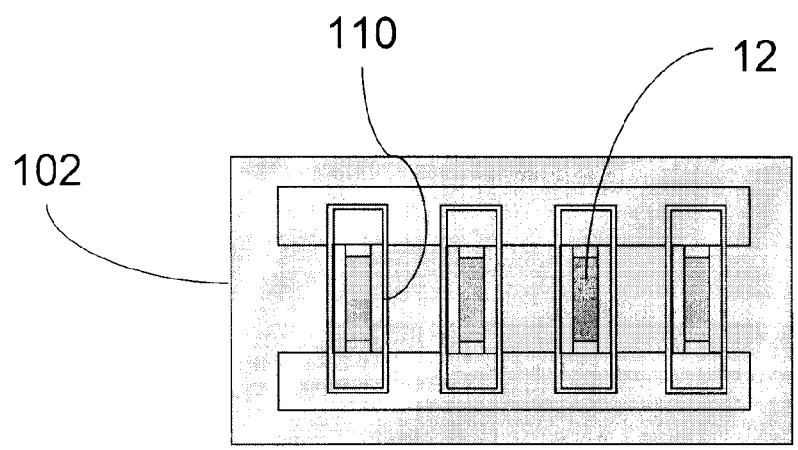

As shown in FIGS. 11A and 11B, an etching process is performed through the exposed areas of the silicon layer 14 adjacent the center portions of the mandrels 100. Prior to this point, an insulator 110 (a combination oxide/nitride spacer) is formed along the sides of the exposed silicon 14 and the sidewall spacers 103. This etching process (or a different material removal process) can be continued to etch portions of the buried oxide layer 12 that is adjacent to the center portions of the mandrels, as shown in FIGS. 12A and 12B. This etching process removes the buried oxide from below the areas of the silicon layer that are adjacent the center portions of the mandrels. This leaves suspended bridges of silicon covered by the mandrels 100 and the sidewall spacers 103, as shown in FIGS. 12A and 12B. These etching processes can comprise multiple directional and non-directional etching processes. For example, a directional (anisotropic) masked etching process can be utilized to remove the exposed portions of the buried insulator 12. Then a second non-directional (isotropic) etching process can be used to remove the buried insulator material 12 from beneath the silicon bridges 14.

Figure 13A:
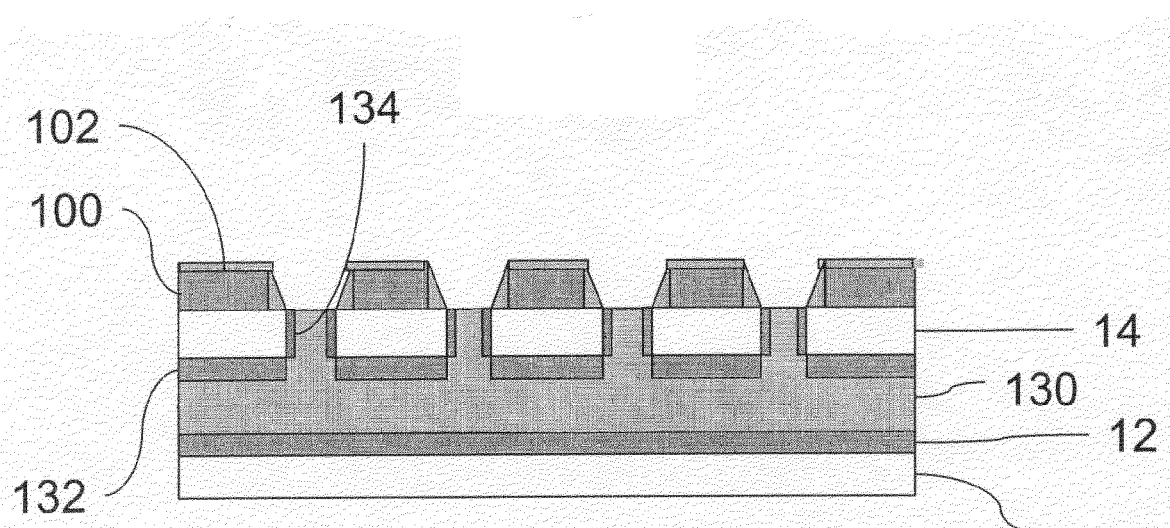
FIGS. 13A and 13B are schematic side and top view diagrams of a partially completed FinFET structure according to a second embodiment of the invention.
Figure 13B:
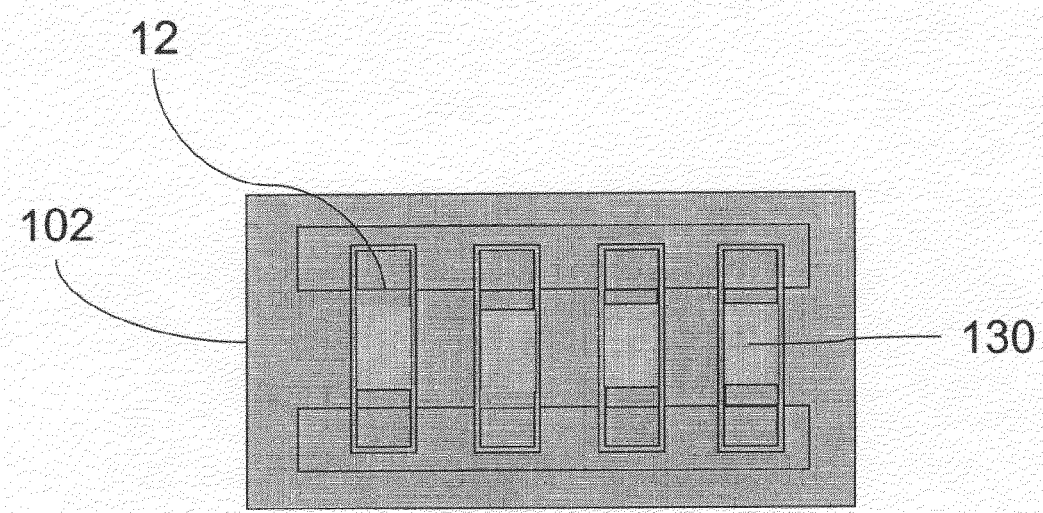
Figure 14A:
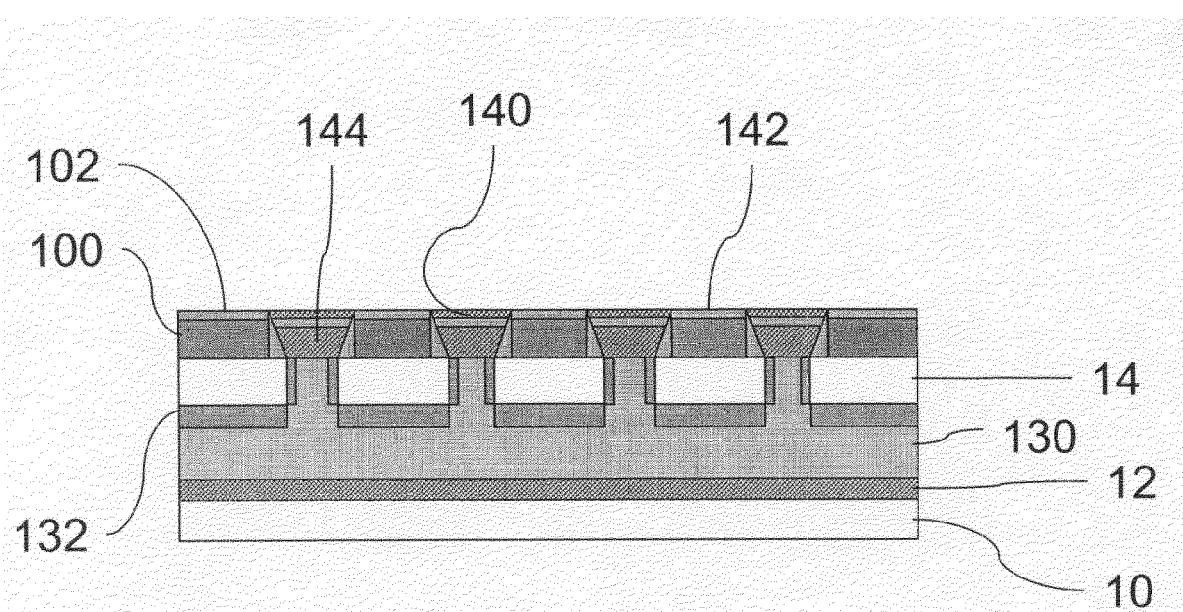
FIGS. 14A and 14B are schematic side and top view diagrams of a partially completed FinFET structure according to a second embodiment of the invention.
Figure 14B:
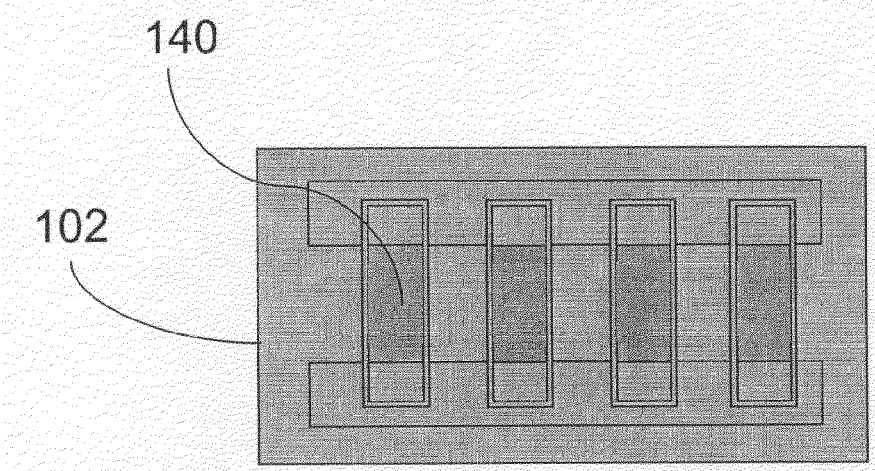

After the buried oxide layer is removed, new buried isolation layers (that are thinner than the previous buried oxide layer but still thick enough to provide adequate substrate isolation) are formed, preferably by a thermal oxidation process. Note that the initial buried oxide layer is chosen to be at least three times the final bottom oxide thickness, to account for multiple buried layers that are created. As shown in FIG. 13B, a masked material removal process can be utilized to selectively pattern the outside layer (e.g., nitride) from sidewall insulators 110 so that they are removed only along the center portions of the mandrels 100 and sidewall spacers 103 to form the back gate oxide. Optionally a short etch step can be used to thin this oxide, which was originally deposited to a thicker layer than the target oxide thickness. Then, this embodiment deposits a back gate conductor 130 into the openings that were created by the etching process. Thus, the back gate conductor 130 is positioned below and beside the silicon bridges 14. As shown in FIGS. 14A and 14B, additional insulators 140, 142, 144 are formed over the back gate conductor 130 in order to electrically isolate the back gate conductor 130 from the later formed front gate conductor. The top insulators 140, 142 can be planarized and/or recessed after formation.

Figure 15A:
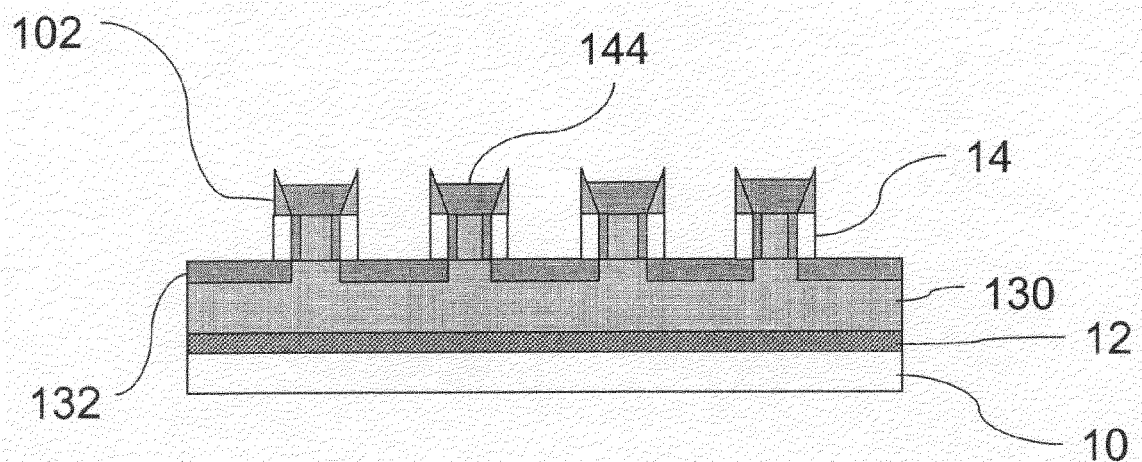
FIGS. 15A and 15B are schematic side and top view diagrams of a partially completed FinFET structure according to a second embodiment of the invention.
Figure 15B:
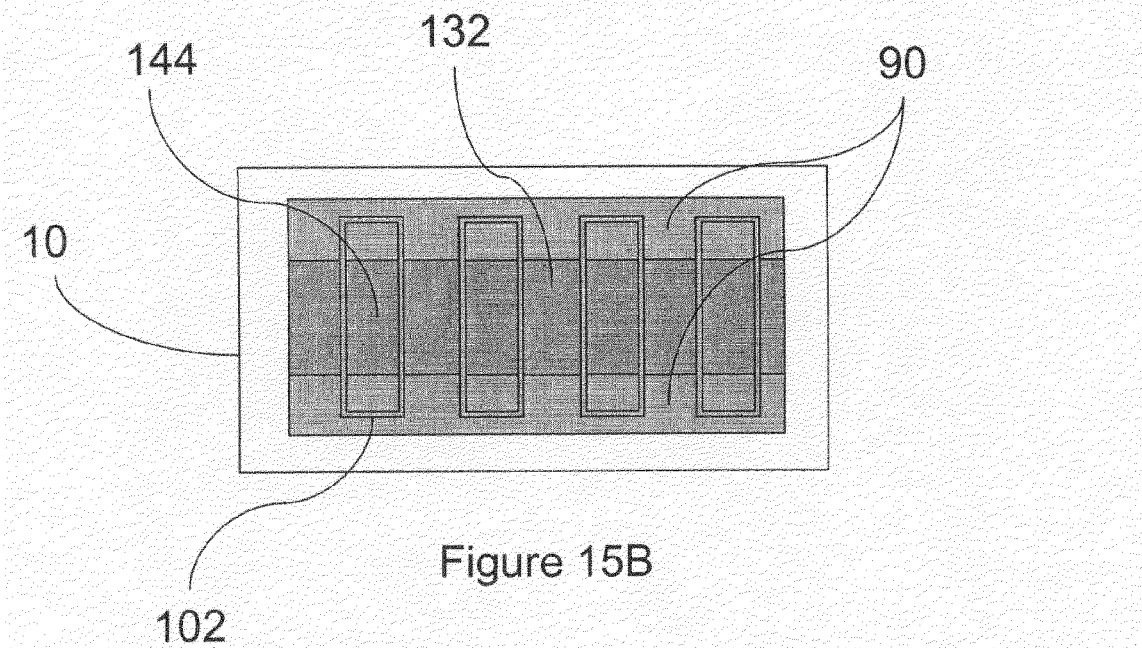
Figure 16A:
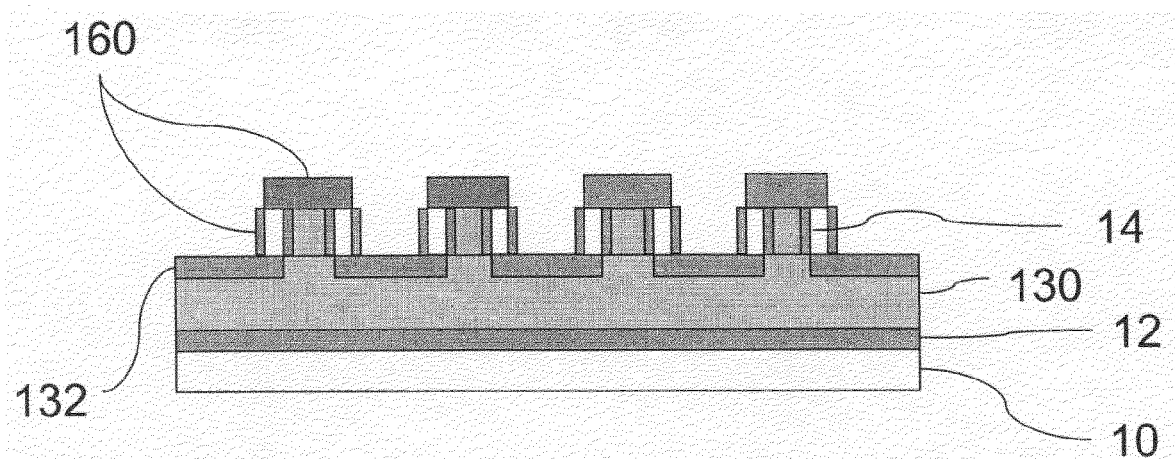
FIGS. 16A and 16B are schematic side and top view diagrams of a partially completed FinFET structure according to a second embodiment of the invention.
Figure 16B:
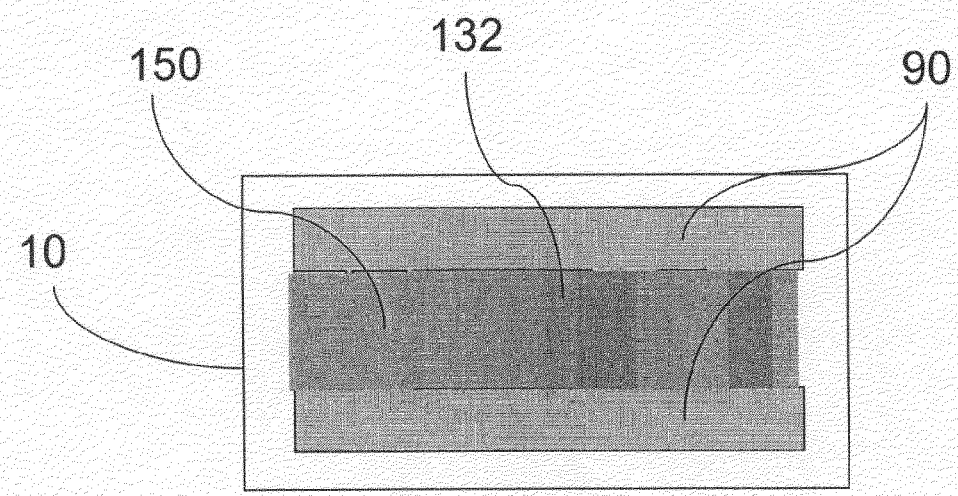

After this, the mandrels 100 and overlying insulators 140, 142 are removed in a selective chemical rinsing process, or any masked etching process, so as to leave the sidewall spacers 102 substantially in place. Then, as shown in FIGS. 15A and 15B, the silicon bridges 14 are etched into silicon fins 14 in a sidewall image transfer process using the sidewall spacers 102 as a mask. The invention then forms a second gate oxide 160 on the exposed portions (sides and tops) of the silicon fins, as shown in FIGS. 16A and 16B. Then, source and drain regions can be formed in the ends of the fins by removing the sidewall insulators 110 from the ends of the fins 14 and implanting impurities in the ends of the fins 14. Optional source/drain epitaxial silicon growth can also be performed at this stage of processing.

Figure 17A:
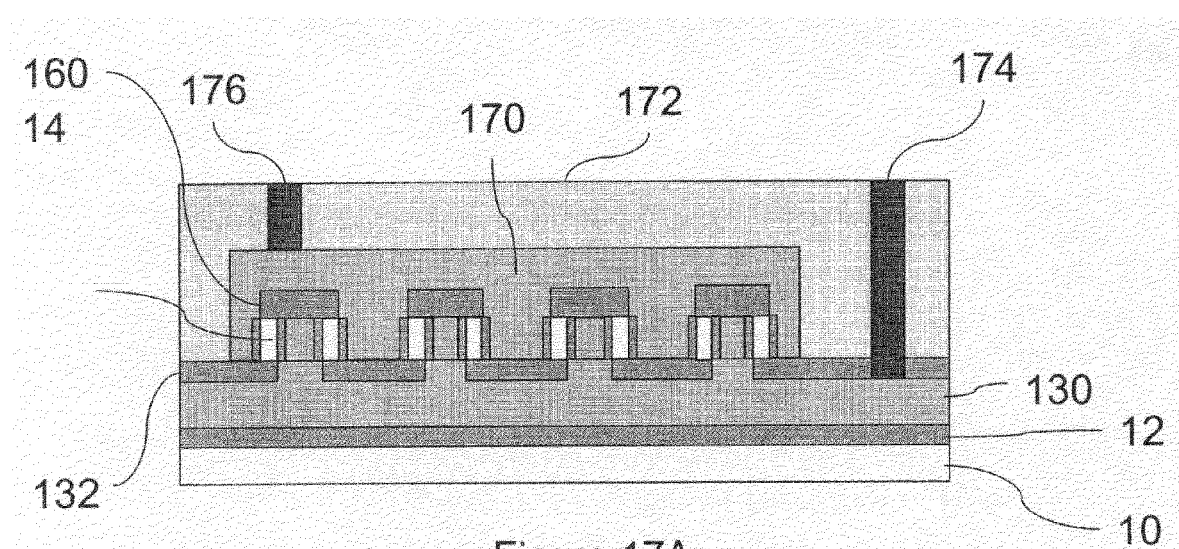
FIGS. 17A and 17B are schematic side and top view diagrams of a partially completed FinFET structure according to a second embodiment of the invention.
Figure 17B:
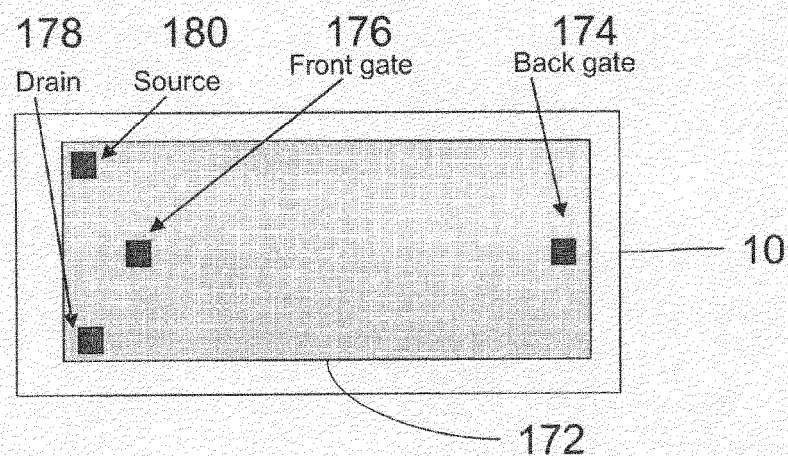

Next, as shown in FIGS. 17A and 17B, the front gate conductor 170 is patterned over the center portions of the fins 14 and between the fins 14 such that the ends of the fins 14 extend from the front gate conductor. An insulator 172 is then formed to cover the structure. In addition, various contacts (back gate contact 174, front gate contact 176, drain contact 178, and source contact 180) are formed using conventional via formation processes that pattern an opening through the covering insulator 172 and then fill the opening with a conductor to make electrical contact down through the insulator 172.

Figure 18:
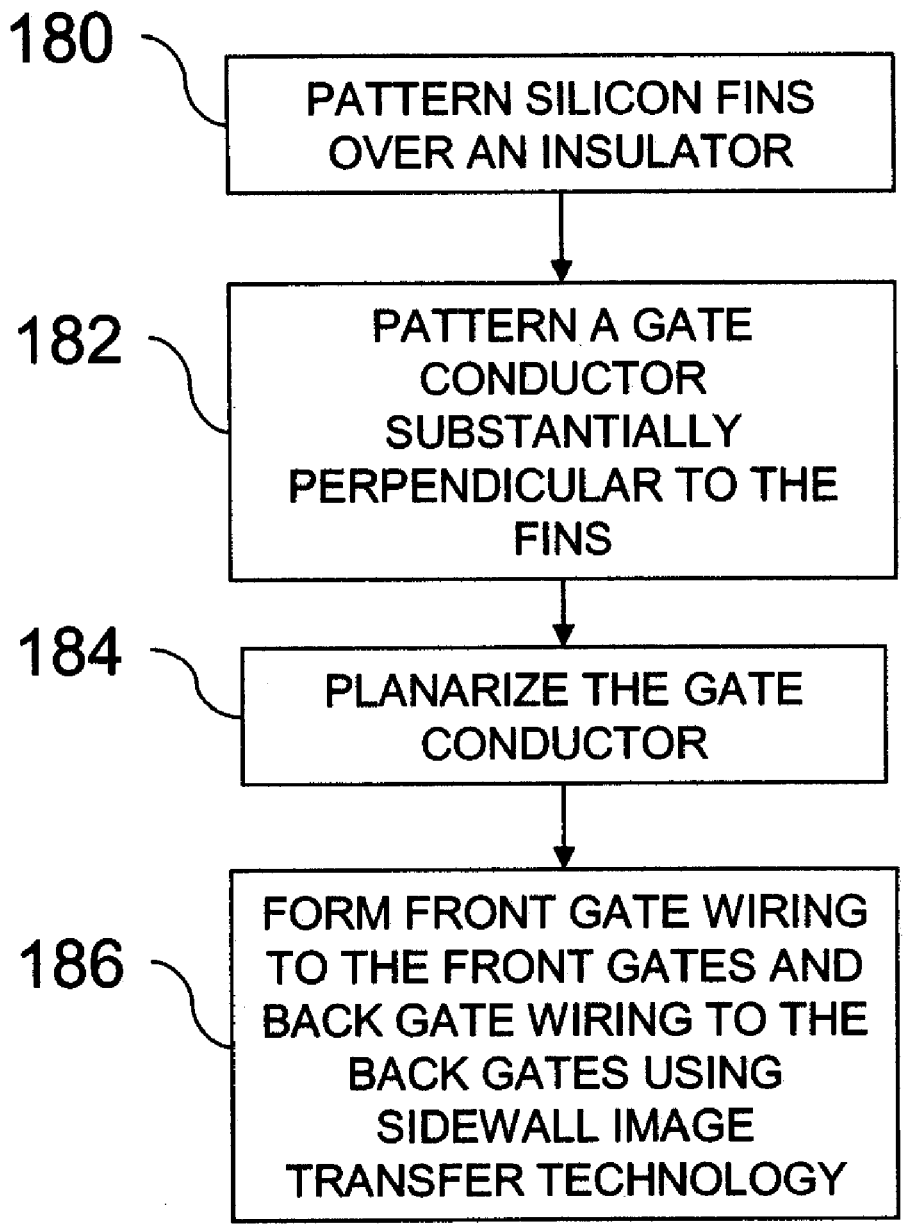
FIG. 18 is a flow diagram illustrating a first embodiment of the invention.

FIG. 18 shows the first embodiment (FIGS. 1A–8B) in flowchart form. More specifically, this embodiment patterns silicon fins over an insulator (180) and patterns a gate conductor at an angle to the fins (182). The gate conductor is formed laterally adjacent to and over center portions of the fins. The gate conductor is planarized (184) such that the gate conductor is separated into distinct gate conductor portions that are separated by the fins. These gate conductor portions include front gates and back gates. The front gates and the back gates alternate along the structure, such that each fin has a front gate on one side and a back gate on the opposite side. The invention then forms front gate wiring to the front gates and back gate wiring to the back gates using sidewall image transfer technology (186).

Figure 19:
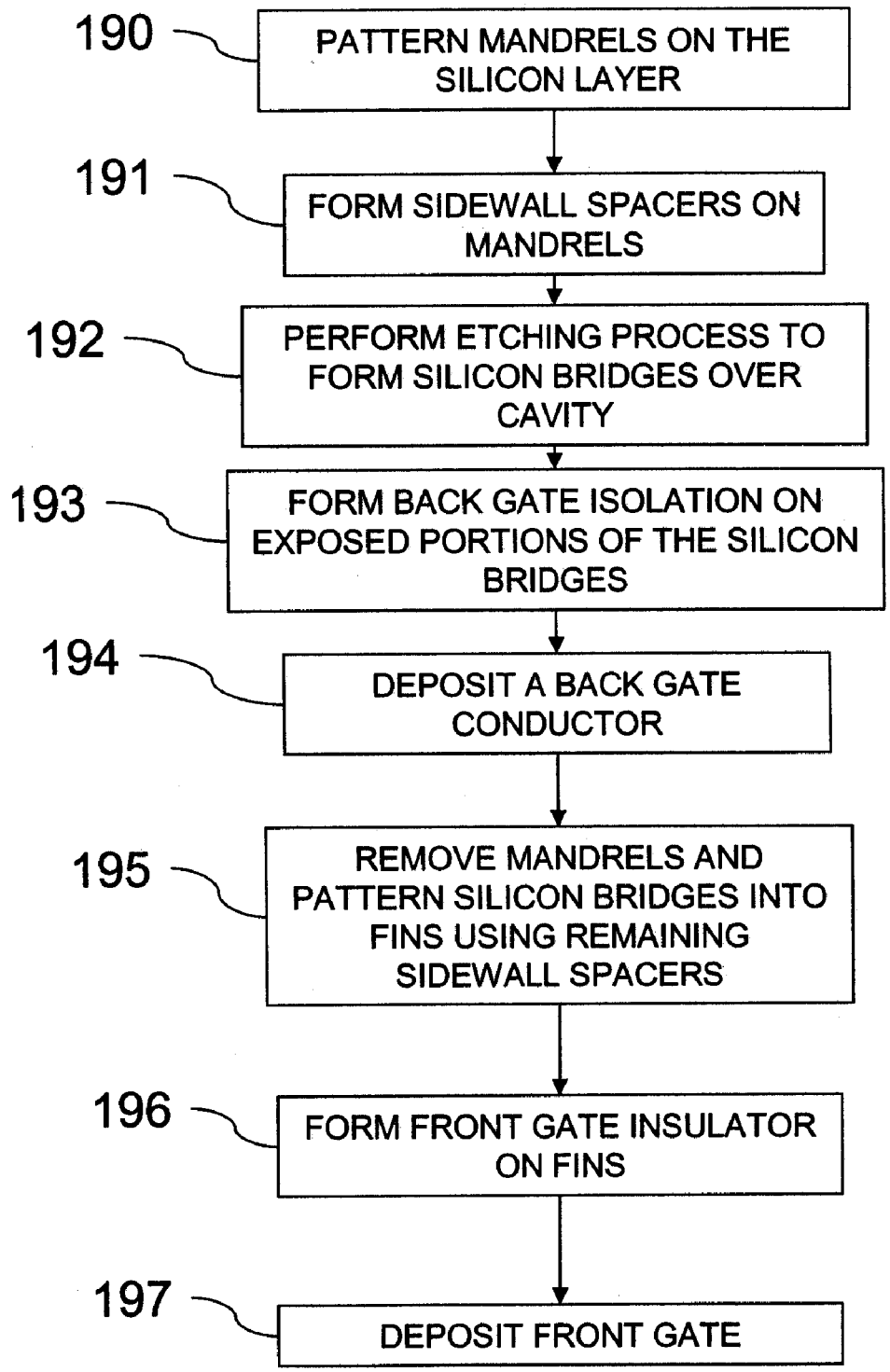
FIG. 19 is a flow diagram illustrating a second embodiment of the invention.

FIG. 19 shows the second embodiment (FIGS. 9A–17B) in flowchart form. More specifically, this embodiment forms a silicon layer on a buried oxide layer and then patterns mandrels on the silicon layer (190). Sidewall spacers are formed (191) on sidewalls of the mandrels to leave portions of the underlying silicon exposed.

An etching process is performed through the exposed areas of the silicon layer (192) adjacent the center portions of the mandrels. This process also etches a cavity into the buried oxide layer that is adjacent to the center portions of the mandrels. This etching process (192) removes the buried oxide from below the areas of the silicon layer that are adjacent the center portions of the mandrels. This leaves suspended bridges of silicon covered by the mandrels and the sidewall spacers.

Next, back gate oxides are formed on exposed portions of the silicon bridges (193). Then this embodiment deposits a back gate conductor (194) into the openings that were created by the etching process. Thus, the back gate conductor is positioned below and beside the silicon bridges. After this, the mandrels are removed (195) so as to leave the sidewall spacers in place. Then, the silicon bridges are etched (195) into fins in a sidewall image transfer process using the sidewall spacers as a mask. The invention then forms a front gate oxide on the exposed portions of the silicon fins (196). Next, the front gate conductor is formed (197) over the center portions of the fins and between the fins such that the ends of the fins extend from the front gate conductor. Source and drain regions are formed in the ends of the fins by removing the source/drain protect layer from the ends of the fins and implanting impurities in the ends of the fins. The protect layer etching process could damage the gate oxide, therefore, the invention can perform a source/drain stripping process after the front gate oxide deposition.

Thus, as shown above, in the first embodiment, the back gate is built at the same level as the front gate, and the gate wiring uses sidewall-image transfer (SIT) shapes. In the second embodiment, the back gate is buried and is fabricated by replacing the buried oxide layer with an oxide-conductor-oxide layer. The second embodiment allows higher density than the first; however, the first embodiment does not require a buried gate. Note that because the second embodiment constructs a buried gate, one ordinarily skilled in the art would understand that an MOS device embodiment could comprise a narrow-width planar double gate transistor.

Double gate advantages include the ability to modify the threshold voltage and off current using an electrical bias. This provides not only dynamically adjustable threshold voltages but also more immunity from the dopant fluctuations that would occur in a scaled CMOS technology due small volume considerations. FinFET devices can provide higher currents and higher packing density than corresponding planar SOI devices. Dual gate FinFETs can be used in applications such as high speed logic, and logic circuitry in which threshold variation via back-gate bias adjustment is used to reduce leakage power in inactive circuitry.

While the invention has been described in terms of preferred embodiments, those skilled in the art will recognize that the invention can be practiced with modification within the spirit and scope of the appended claims.

What is claimed is:

1. A dual gate fin-type field effect transistor (FinFET) structure comprising:
    silicon fins over an insulator, wherein center portions of said fins comprise channel regions and end portions of said fins comprise source and drain regions;
    front gates and back gates positioned adjacent said center portions of said fins, wherein said front gates and back gates alternate along a length of said structure, such that each fin has a front gate on one side and a back gate on the opposite side;
    front gate wiring connected to said front gates; and
    back gate wiring connected to said back gates;
    wherein said front gate wiring and said back gate wiring lie within the same plane and run perpendicular to said length of said structure; and
    wherein said front gate wiring and said back gate wiring comprise conductive sidewalls.

2. The structure in claim 1, wherein said front gate wiring extends in a first direction away from said front gates and said back gate wiring extends in an opposite direction away from said back gates.

3. The structure in claim 1, wherein said front gate wiring and said back gate wiring is substantially parallel to said fins.

4. The structure in claim 1, wherein said front gates are electrically isolated from said back gates.

5. The structure in claim 1, further comprising insulators above said fins, wherein said fins and said insulators keep said front gates and said back gates electrically isolated.

6. The structure in claim 1, wherein said front gate wiring and said back gate wiring comprise at least one of conductive sidewalls and conductive fins.

7. A dual gate fin-type field effect transistor (in FinFET) structure comprising:
    silicon fins over an insulator, wherein center portions of said fins comprise channel regions and end portions of said fins comprise source And drain regions;
    front gates and back gates positioned adjacent said center portions of said fins, wherein said front gates and back gates alternate along a length of said structure, such that each fin has a front gate on one side and a back gate on the opposite side;
    front gate wiring connected to said front gates;
    back gate wiring connected to said back gates;
    wherein said front gate wiring extends in a first direction away from said front gates and said back gate wiring extends in an opposite direction away from said back gates;
    wherein said front gate wiring and said back gate wiring comprise conductive sidewalls; and
    an insulator below said front gates and said back gates, wherein said front gate wring and said back gate wiring are positioned above said front gates and said back gates.

8. The structure in claim 7, wherein said front gate wiring and said back gate wiring is substantially parallel to said fins.

9. The structure in claim 7, wherein said front gates are electrically isolated from said back gates.

10. The structure in claim 7, further comprising insulators above said fins, wherein said fins and said insulators keep said front gates and said back gates electrically isolated.

11. The structure in claim 7, wherein said front gate wiring and said back gate wiring comprise at least one of conductive sidewalls and conductive fins.

12. A dual gate fin-type field effect transistor (FinFET) structure comprising:
    silicon fins over an insulator, wherein center portions of said fins comprise channel regions and end portions of said fins comprise source and drain regions;
    front gates and back gates positioned adjacent said center portions of said fins, wherein said front gates and back gates alternate along a length of said structure, such that each fin has a front gate on one side and a back gate on the opposite side;
    front gate wiring connected to said front gates; and
    back gate wiring connected to said back gates,
    wherein said front gate wiring and said back gate wiring are positioned above said front gates and said back gates, and
    wherein said front gate wiring and said back gate wiring comprise conductive sidewalls.

13. The structure in claim 12, wherein said front gate wiring extends in a first direction away from said front gates and said back gate wiring extends in an opposite direction away from said back gates.

14. The structure in claim 12, wherein said front gate wiring and said back gate wiring is substantially parallel to said fins.

15. The structure in claim 12, wherein said front gates are electrically isolated from said back gates.

16. The structure in claim 12, further comprising insulators above said fins, wherein said fins and said insulators keep said front gates and said back gates electrically isolated.

* * * * *